United States Patent
Shin et al.

(10) Patent No.: US 7,977,730 B2
(45) Date of Patent: Jul. 12, 2011

(54) MEMORY DEVICE AND FABRICATION METHOD THEREOF

(75) Inventors: Yoo-Cheol Shin, Suwon-shi (KR); Jeong-Hyuk Choi, Yongin-shi (KR); Sung-Hoi Hur, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/385,664

(22) Filed: Apr. 15, 2009

(65) Prior Publication Data

US 2009/0206392 A1 Aug. 20, 2009

Related U.S. Application Data

(60) Continuation of application No. 11/790,047, filed on Apr. 23, 2007, now Pat. No. 7,538,385, which is a continuation of application No. 11/048,852, filed on Feb. 3, 2005, now Pat. No. 7,223,659, which is a division of application No. 10/382,923, filed on Mar. 7, 2003, now Pat. No. 6,867,453.

(30) Foreign Application Priority Data

May 23, 2002 (KR) .............................. 2002-0028647

(51) Int. Cl.
*H01L 29/788* (2006.01)
(52) U.S. Cl. ................. 257/316; 257/E27.078
(58) Field of Classification Search .......... 257/315–321, 257/E27.078
See application file for complete search history.

(56) References Cited

U.S. PATENT DOCUMENTS

| | | | | |
|---|---|---|---|---|
| 4,332,077 A | * | 6/1982 | Hsu | 438/257 |
| 4,859,619 A | | 8/1989 | Wu et al. | |
| 5,110,753 A | * | 5/1992 | Gill et al. | 438/262 |
| 5,120,672 A | * | 6/1992 | Mitchell et al. | 438/261 |
| 5,424,569 A | | 6/1995 | Prall | |
| 5,514,889 A | | 5/1996 | Cho et al. | |
| 5,856,221 A | * | 1/1999 | Clementi et al. | 438/258 |
| 5,872,034 A | * | 2/1999 | Schlais et al. | 438/257 |
| 6,380,032 B1 | | 4/2002 | Lee et al. | |
| 6,614,070 B1 | | 9/2003 | Hirose et al. | |
| 6,667,511 B1 | | 12/2003 | Fang | |
| 6,734,065 B2 | | 5/2004 | Yim et al. | |
| 6,803,272 B1 | * | 10/2004 | Halliyal et al. | 438/240 |

OTHER PUBLICATIONS

US 6,642,753, 11/2003, Choi (withdrawn).

* cited by examiner

*Primary Examiner* — Richard A. Booth
(74) *Attorney, Agent, or Firm* — Harness, Dickey & Pierce, P.L.C.

(57) ABSTRACT

A method of forming a memory device, where a first insulator layer and a charge trapping layer may be formed on a substrate, and at least one of the first insulator layer and charge trapping layer may be patterned to form patterned areas. A second insulation layer and a conductive layer may be formed on the patterned areas, and one or more of the conductive layer, second insulator layer, charge trapping layer and first insulator layer may be patterned to form a string selection line, ground selection line, a plurality of word lines between the string selection and ground selection lines on the substrate, a low voltage gate electrode, and a plurality of insulators of varying thickness. The formed memory device may be a NAND-type non-volatile memory device having a SONOS gate structure, for example.

13 Claims, 11 Drawing Sheets

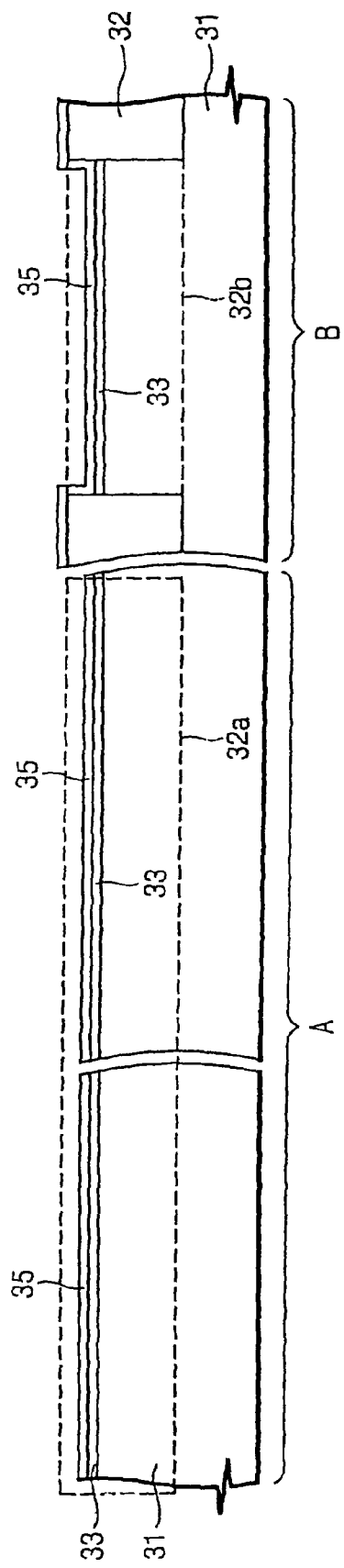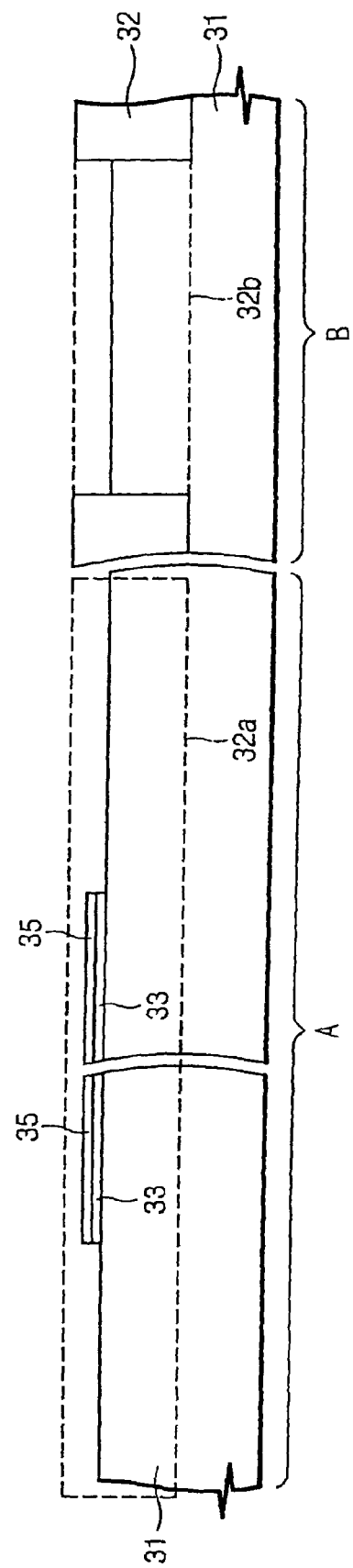

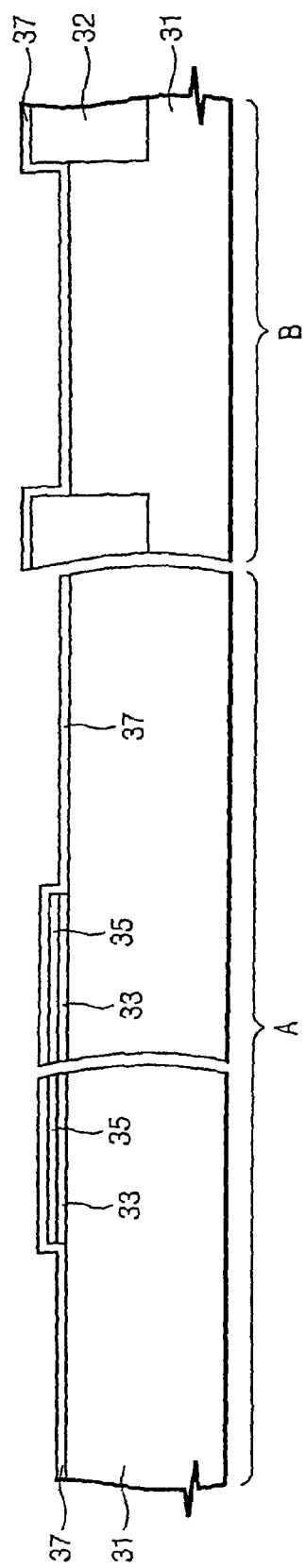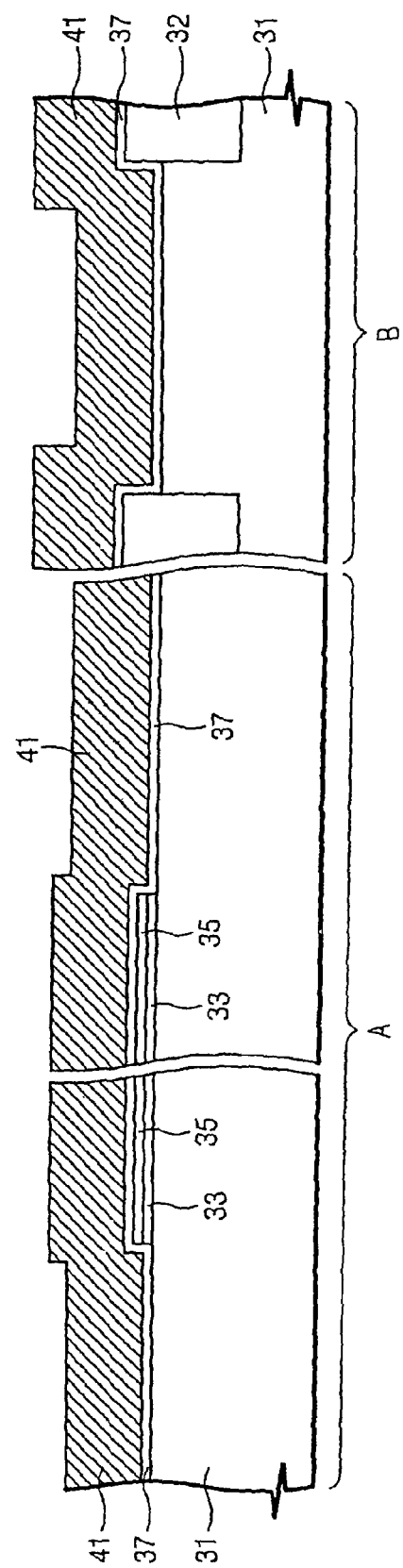

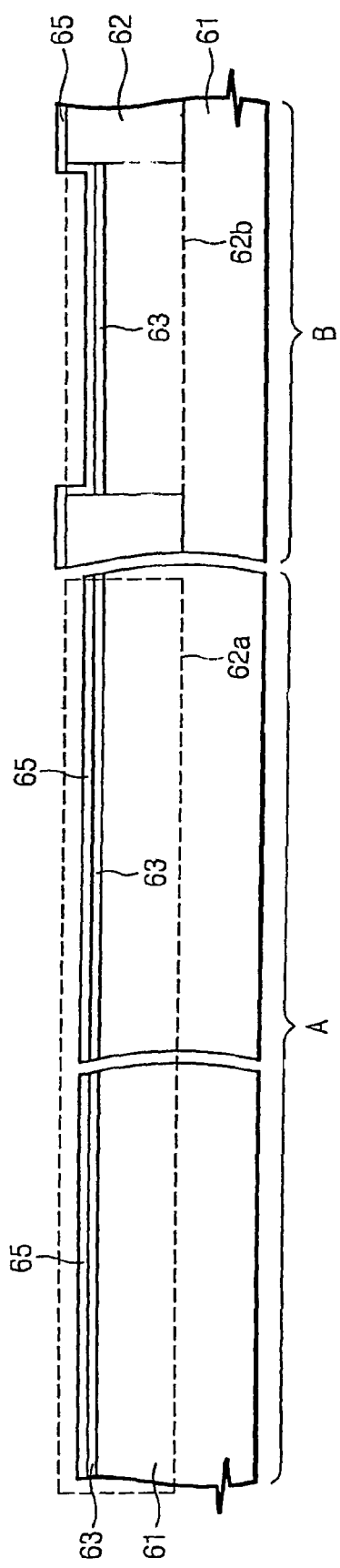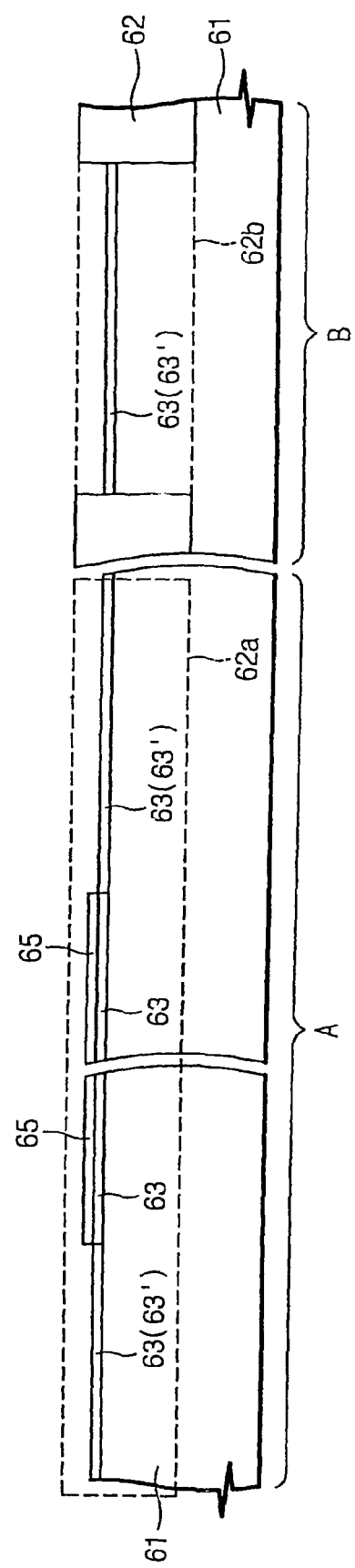

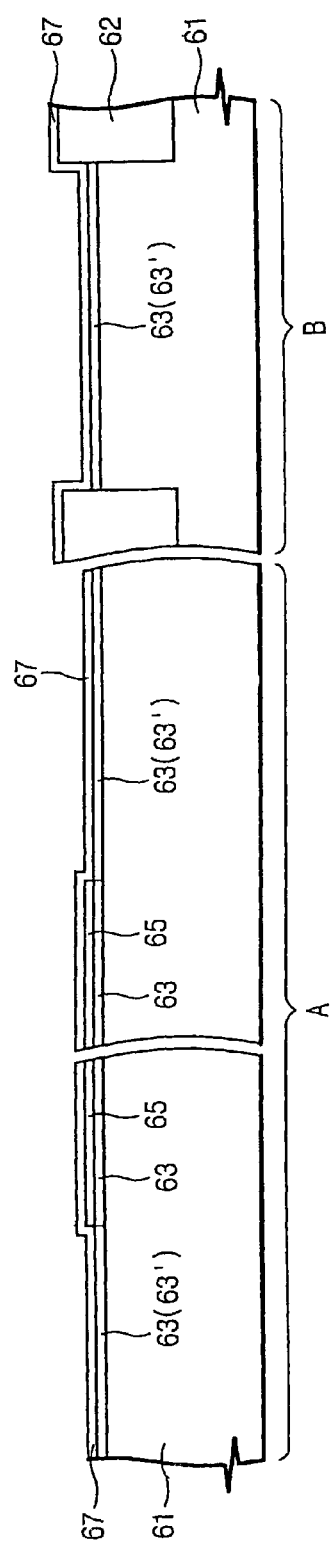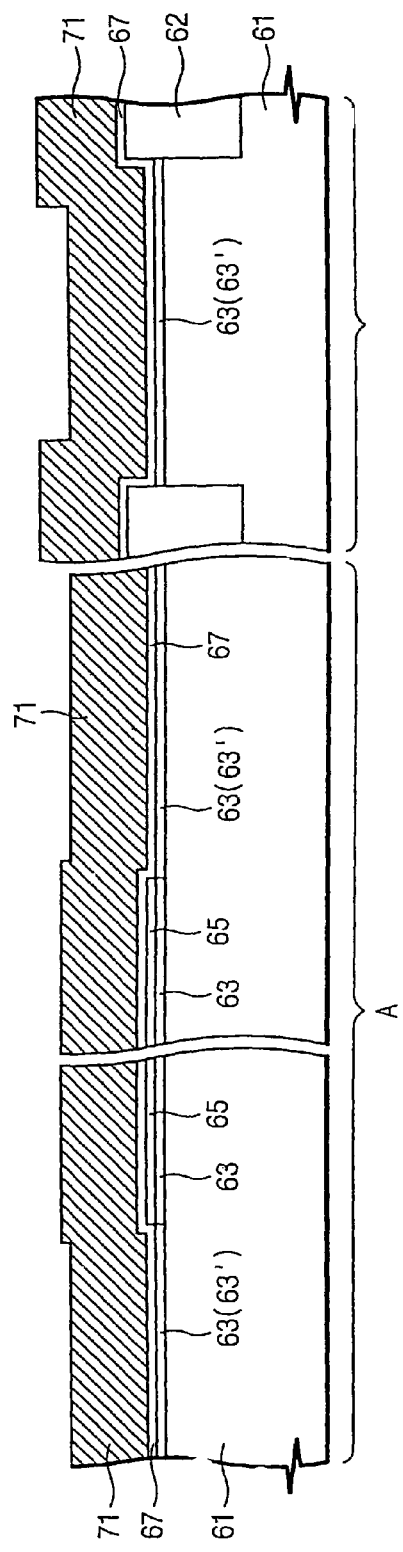

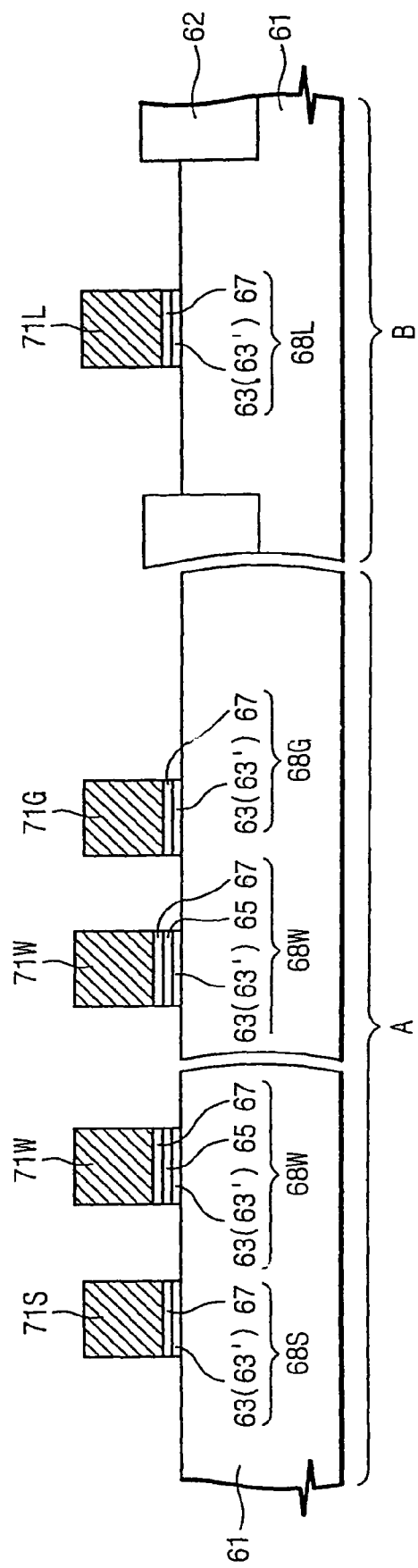

MEMORY DEVICE AND FABRICATION METHOD THEREOF

CROSS-REFERENCE TO RELATED CASES

This is a continuation of U.S. patent application Ser. No. 11/790,047, filed on Apr. 23, 2007 now U.S. Pat. No. 7,538,385, which is a continuation of U.S. patent application Ser. No. 11/048,852 filed on Feb. 3, 2005, which issued as U.S. Pat. No. 7,223,659 on May 29, 2007, which is a divisional application of U.S. patent application Ser. No. 10/382,923 filed on Mar. 7, 2003, which issued as U.S. Pat. No. 6,867,453 on Mar. 15, 2005, which is a U.S. nonprovisional patent application claiming priority under 35 U.S.C. §119 to Korean Patent Application No. 2002-0028647, filed on May 23, 2002, in the Korean Intellectual Property Office (KIPO), the entire contents of all of which are hereby incorporated by reference.

BACKGROUND OF THE INVENTION

1. Field of the Invention

The present invention relates to a memory device and a fabrication method thereof.

2. Description of Related Art

A memory device, such as a non-volatile memory device with a SONOS gate structure, for example, includes a charge trapping layer which stores charges in an isolated trap within the charge trapping layer. The non-volatile memory device may operate at a low operation voltage of 5-10V, and may have a simple device structure. Thus, the non-volatile memory device with a SONOS gate structure may be more easily fabricated in an effort to improve or achieve higher integration within a circuit.

FIG. 1 is a cross-sectional view illustrating a portion of a cell array area of a conventional NAND-type non-volatile memory device.

Referring to FIG. 1, a ground selection line 11G and string selection line 11S are disposed in parallel on a semiconductor substrate 1. A plurality of parallel word lines 11W are disposed between the ground selection line 11G and the string selection line 44S. A ground selection gate insulator 8G is interposed between the ground selection line 11G and the semiconductor substrate 1, and a string selection gate insulator 8S is interposed between the string selection line 11S and the semiconductor substrate 1. Similarly, a cell gate insulator 8C is interposed between each of the word lines 11W and the semiconductor substrate 1. The cell gate insulator 8C comprises a tunnel insulator 3, a charge trapping layer 5 and a blocking insulator 7 which are sequentially stacked. In addition, the string selection gate insulator 8S and ground selection gate insulator 8G have structure identical to cell gate insulator 8C.

Since the string selection gate insulator 8S, ground selection gate insulator 8G and cell gate insulator 8C of the conventional NAND-type non-volatile memory device have identical structure, threshold voltages of a string selection transistor and a ground selection transistor may be identical with an initial threshold voltage of a cell transistor. As a result, a voltage, higher than a threshold voltage of a MOS transistor used for a peripheral circuit area should be applied to a string selection line and a ground selection line in order to turn on the string selection transistor and ground selection transistor. However, the string selection transistor and ground selection transistor may be weakly programmed when a voltage exceeding threshold voltages of the string selection transistor and ground selection transistor is applied to the string selection line and/or the ground selection line. This in turn may cause threshold voltages of the string selection transistor and ground selection transistor to increase, leading to higher power consumption when driving the string selection transistor and the ground selection transistor.

SUMMARY OF THE INVENTION

Exemplary embodiments of the present invention is directed to a memory device, such as a NAND-type non-volatile memory device, and a fabrication method thereof which may provide a string selection transistor and a ground selection transistor having a lower threshold voltage than in conventional NAND-type non-volatile memory devices with SONOS gate structures, for example.

Accordingly, a memory device in accordance with various exemplary embodiments of the present invention may include a string selection gate insulator and a ground selection gate insulator that may be configurable as a single layered blocking insulator, or configurable as a double-layered structure of a blocking insulator and a tunnel insulator, for example.

An exemplary embodiment is directed to a method of forming a memory device, where a first insulator layer and a charge trapping layer may be formed on a substrate, and where at least one of the first insulator layer and charge trapping layer may be patterned to form patterned areas. A second insulation layer and a conductive layer may be formed on the patterned areas, and one or more of the conductive layer, second insulator layer, charge trapping layer and first insulator layer may be patterned to form a string selection line, ground selection line, a plurality of word lines between the string selection and ground selection lines on the substrate, a low voltage gate electrode, and a plurality of insulators of varying thickness. The formed memory device may be a NAND-type non-volatile memory device having a SONOS gate structure, for example.

A NAND-type non-volatile memory device in accordance with another exemplary embodiment of the present invention may include a string selection line and a ground selection line that are substantially parallel to each other and cross an active region of a semiconductor substrate. The active region may be defined by a field oxide, for example. A plurality of word lines may be disposed in parallel relation between the string selection line and the ground selection line.

A cell gate insulator may be interposed between each of the word lines and the active region, and composed of a tunnel insulator, charge trapping layer and blocking insulator, for example. These layers may be sequentially stacked on the substrate. A string selection gate insulator may be interposed between the string selection line and the active region and a ground selection gate insulator may be interposed between the ground selection line and the active region.

Another exemplary embodiment is directed to a method of fabricating a NAND-type non-volatile memory device, where a tunnel insulator and charge trapping layer may be sequentially formed on a semiconductor substrate. At least the charge trapping layer may be patterned to form a charge trapping layer pattern on the semiconductor substrate. The pattern may be formed at a specified location or predetermined region of the substrate. A blocking insulator and gate conductive layer may be formed on the semiconductor substrate. The gate conductive layer, blocking layer, charge trapping layer pattern and tunnel insulator may be patterned to form a string selection line, word lines, and a ground selection line which are substantially parallel to each other, and, simultaneously, to form a cell gate insulator interposed between each the word lines and the semiconductor substrate, a string selection gate insulator interposed between the string selection line and the semiconductor substrate, and a ground selection gate insulator interposed between the ground selection line and the semiconductor substrate over the semiconductor substrate.

Another exemplary embodiment is directed to a method of forming a NAND-type non-volatile memory device that includes preparing a semiconductor substrate having a cell array area and a peripheral circuit area. A tunnel insulator and a charge trapping layer may be formed on the semiconductor substrate, and then patterned to form a stacked layer that exposes one or more specified regions of the cell array area and peripheral circuit area. A blocking insulator and a gate conductive layer may be formed on the semiconductor substrate. The gate conductive layer, blocking insulator, charge trapping layer pattern and tunnel insulator pattern may be patterned to form a string selection line, plurality of word lines and a ground selection line which are substantially parallel to each other within the cell array area, to form a low-voltage gate electrode within the peripheral circuit area, and, simultaneously, to form a cell gate insulator string selection gate insulator and ground selection gate insulator as arranged in the previous exemplary embodiment, and a low-voltage gate insulator interposed between the low-voltage gate electrode and the semiconductor substrate.

Another exemplary embodiment is directed to a method of forming a NAND-type non-volatile memory device. The method is similar to the previous embodiment, but only the charge trapping layer is patterned to form a charge trapping layer pattern at specified locations within the semiconductor substrate in the cell array area. In this exemplary embodiment, the tunnel insulator, exposed through the charge trapping layer, may be patterned to form a tunnel insulator pattern under the charge trapping layer pattern, which simultaneously exposes a portion of the semiconductor substrate in the cell array area and in the peripheral semiconductor substrate. The semiconductor substrate with tunnel insulator pattern may be oxidized to form a thermal oxide corresponding to the tunnel insulator on the exposed semiconductor substrate.

BRIEF DESCRIPTION OF THE DRAWINGS

Exemplary embodiments of the present invention will become more fully understood from the detailed description given hereinbelow and the accompanying drawings, wherein like elements are represented by like reference numerals, which are given by way of illustration only and thus are not limitative of the present invention and wherein:

FIGS. 5A through 5E are cross-sectional views illustrating a method of forming the NAND-type non-volatile memory device of FIG. 4;

FIGS. 7A through 7E are cross-sectional views illustrating a method of forming the NAND-type non-volatile memory device of FIG. 6.

DETAILED DESCRIPTION OF THE EXEMPLARY EMBODIMENTS

Figure 1:
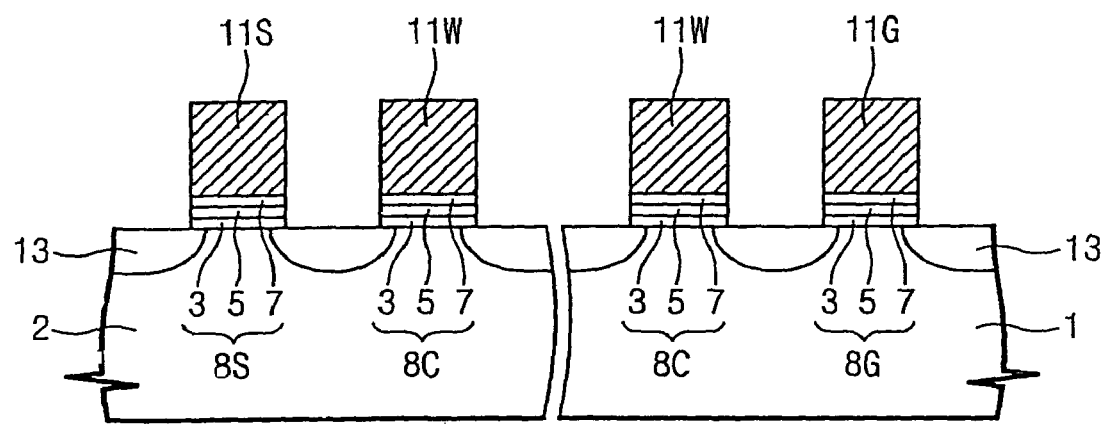
FIG. 1 is a cross-sectional view illustrating a portion of a cell array area of a conventional NAND-type non-volatile memory device.

The present invention will now be described more fully hereinafter with reference to the accompanying drawings, in which exemplary embodiments of the present invention are shown. This invention may, however, be embodied in different forms and should not be construed as limited to the exemplary embodiments set forth herein. Rather, these exemplary embodiments are provided so that this disclosure will be thorough and complete, and will fully convey the scope of the present invention to those skilled in the art. In the drawings, the thickness of layers and regions are exaggerated for clarity. As used herein, the term "on", as when a layer is described as being "on" another layer, may be defined as being directly on the other layer, or on top of the other layer with one or more intervening layers therebetween. Like numbers refer to like elements, and the reference characters "A" and "B" represent a cell array area and a peripheral circuit area, respectively throughout and in each drawing.

Figure 2:
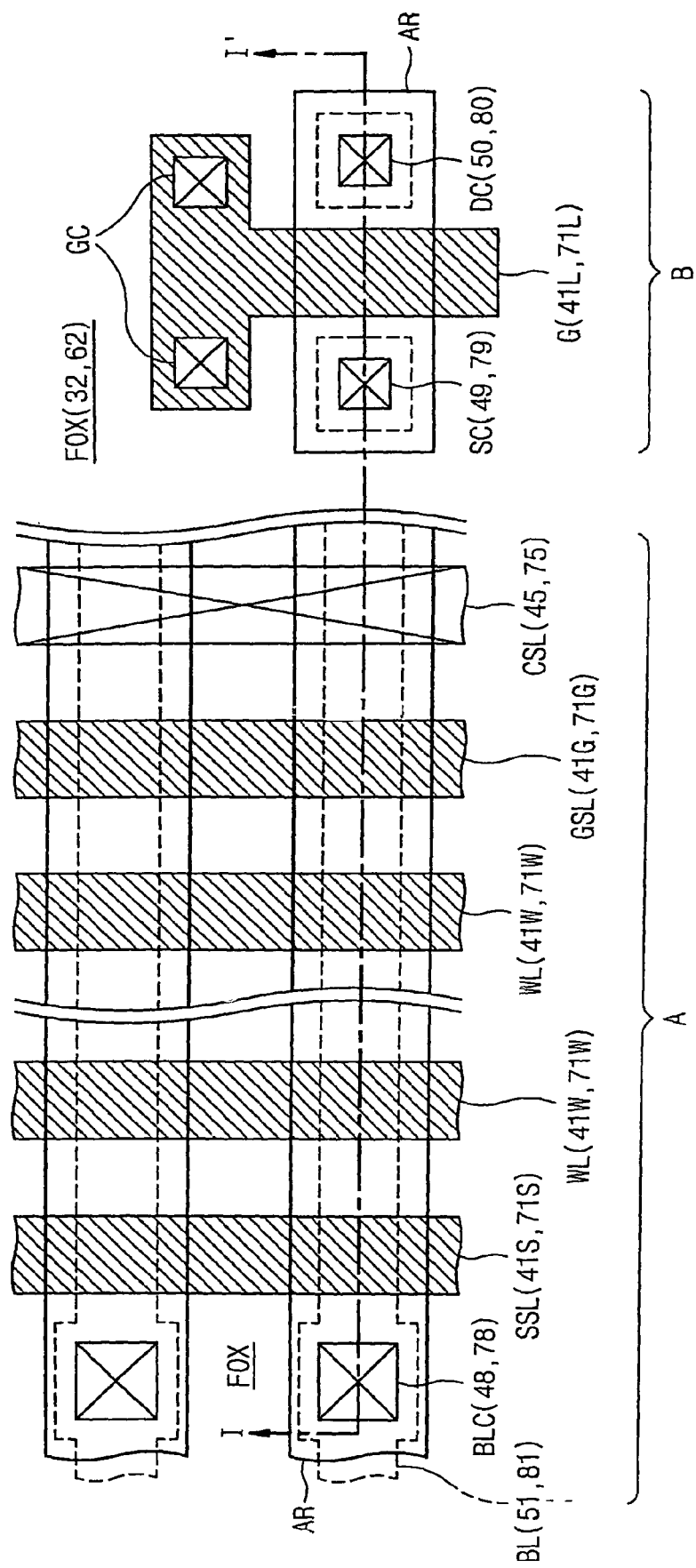
FIG. 2 is a top view illustrating a general NAND-type non-volatile memory device in accordance with an exemplary embodiment of the invention.

FIG. 2 is a top view illustrating a general NAND-type non-volatile memory device in accordance with an exemplary embodiment of the invention. In FIG. 2, reference numbers in parentheses represent corresponding elements of FIGS. 4 and 6, respectively.

Referring to FIG. 2, a string selection line SSL (41S, 71S) a ground selection line GSL (41G, 71G) and a plurality of word lines WL (41W, 71W) there between are present at a cell array region A. The SSL, the GSL, and the WLs are parallel to one another and cross over an active region AR defined by a field oxide FOX. A bit line contact BLC (48, 78) applying a voltage through a bit line BL (51, 81) crossing over the lines such as SSL, GSL and WL are disposed adjacent to the string selection line. A common source line CSL (45, 75) for grounding is disposed adjacent to the GSL. On the other hand, a gate electrode G (41L, 71L) is located in an active region AR defined by the FOX (32, 62) at the peripheral circuit area B. A source contact SC (49, 79) and a drain contact DC (50, 80) are located at both sides of the gate electrode G. A gate electrode GC is connected to the gate electrode G.

Figure 3:
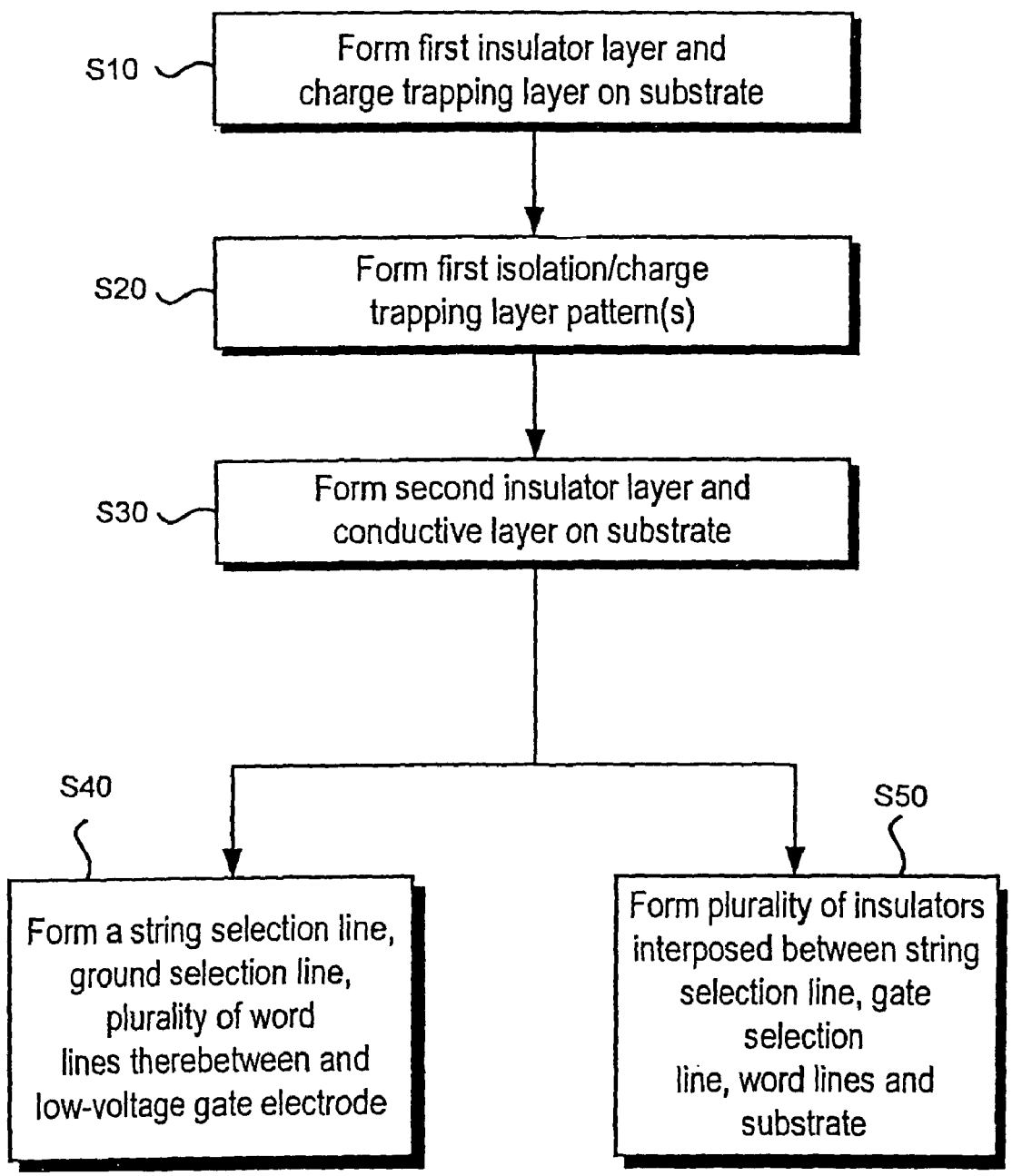
FIG. 3 is a flow chart described a method in accordance with an exemplary embodiment of the invention.

FIG. 3 is a flow chart describing a method in accordance with an exemplary embodiment of the invention. Generally, in order to fabricate a memory device in accordance with an exemplary embodiment of the invention, a number of sequential, but alternating forming and pattern processes may be required in order to form various layers of the device. For example, and as to be described in more detail below, a first insulator layer and a charge trapping layer may be formed (Step S10) on a semiconductor substrate. For example, the first insulation layer may be formed by coating the substrate with a field oxide to provide an active region, and thermally oxidizing the field oxide and substrate so as to form a thermal oxide (e.g., $SiO_2$) as the first insulator layer, or tunnel insulator, on the active region. The charge trapping layer may be formed of silicon nitride ($Si_3N_4$) by a suitable deposition process, as discussed further below. These two layers may be formed sequentially, one layer after the other layer, for example.

The first insulation layer and charge trapping layer may be patterned (Step S20) to provide exposed areas of the active region at specified locations along the substrate. The patterning process may be performed using a photoresist pattern, as discussed further below. A second insulation layer and conductive layer may be formed (Step S30) along the substrate and on the patterned areas of the first insulation and charge trapping layers, by a suitable deposition process, as discussed in more detail below. The second insulator layer, or blocking insulator, may be formed of a material having a high-k dielectric (e.g., a suitable metal oxide) as to be discussed further below, and the conductive layer may be formed of a suitable polysilicon/metal silicide material, for example.

Referring to FIG. 3, a string selection line, ground selection line, a plurality of word lines provided between the string selection and ground selection lines along the substrate, and a low voltage gate electrode may be formed (Step S40). These lines and gate electrode may be formed by patterning the conductive layer, second insulator layer, charge trapping layer and first insulator layer. Simultaneously, a plurality of insulators may be formed (Step S50) so as to be interposed between the string selection line, ground selection line, plurality of word lines and substrate, etc. The plurality of insulators may be of varying thickness, or have a varying number of layers. For example, one or more cell gate insulators may be formed between the word lines and the semiconductor substrate; one or more (string or ground) selection gate insulators may be formed between the string (or ground) selection lines and substrate, and one or more low-voltage gate insulators may be formed between the a low-voltage gate electrode and semiconductor substrate, as to be illustrated in further detail below. The cell gate insulator may consist of sequentially stacked layers (e.g., first insulation layer, charge trapping layer, second insulator layer), and the selection gate insulators and low-voltage gate insulator may comprise of only one of the layers, such as the second insulator layer (e.g., blocking insulator) for example. Each of these insulators may be provided at specified regions along the substrate. Thus, a memory device, such as a NAND-type non-volatile memory device having a SONOS gate structure, may be provided that operates at a low voltage, so as to reduce power consumption in components employing such memory devices. Additionally, since the second insulator layer may be formed of a high-k dielectric material, potential current leakage may be prevented.

Figure 4:
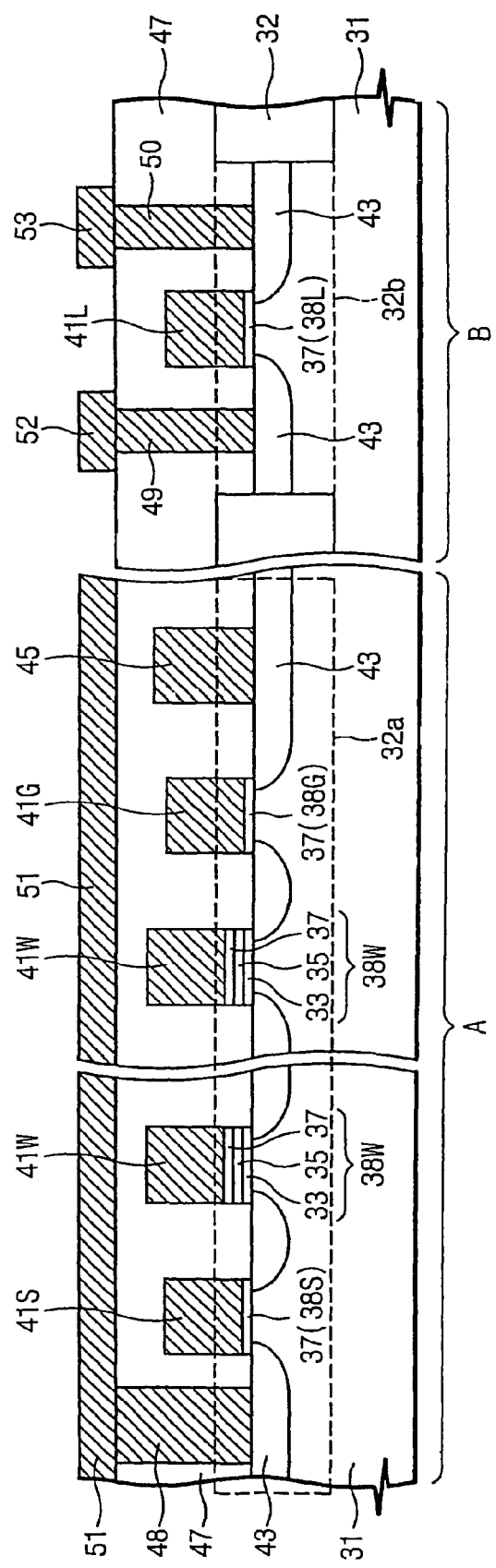
FIG. 4 is a cross-sectional view illustrating a NAND-type non-volatile memory device taken along a line of I-I' of FIG. 2 in accordance with an exemplary embodiment of the present invention.

FIG. 4 is a cross-sectional view illustrating a NAND-type non-volatile memory device taken along a line I-I' of FIG. 2.

As illustrated in FIG. 4, a tunnel oxide layer 33, charge trapping layer 35, and blocking insulator 37 may be sequentially stacked and interposed between a word line 41W and an active region (denoted by dotted line 32a) at a cell array area A of a semiconductor substrate 31. The active region may be defined by a field oxide 32, for example. the tunnel oxide layer 33, charge trapping layer 35 and blocking insulator 37 may constitute a cell gate insulator 38W, for example. A blocking insulator 37 may be interposed between active region 32a and a string selection line 41S, and between active region 32a and ground selection line 41G in cell array area A. Blocking insulator 37 may be interposed between a gate electrode 41L of a low-voltage transistor and the active region 32b (see dotted line) at a peripheral circuit area B. Blocking insulator 37 may be a single-layered structure, and may be embodied as any of a string selection gate insulator 38S, ground selection gate insulator 38G, and a gate insulator 38L of a low-voltage transistor, as shown in FIG. 4.

An impurity diffusion layer 43 may be disposed on semiconductor substrate 31, such as at both sides of each line (i.e., 41S, 41W and 41G) and on either side of gate electrode 41L of the low-voltage transistor, for example. An interlayer dielectric 47 may be provided on semiconductor substrate 31. One portion of the impurity diffusion layer 43 may be interconnected to a bit line contact 48 penetrating through interlayer dielectric 47, as seen in FIG. 4. Another portion of impurity diffusion layer 43, located on an opposite side of the word lines 41W from an adjacent ground selection line 41G, may be interconnected to a common source line 45 within interlayer dielectric 47. A portion of the impurity diffusion layers 43 present in the peripheral circuit area B may connect a source contact 49 and a drain contact 50 that penetrate interlayer dielectric 47. A bit line 51 connecting the bit line contact 48 may be provided on interlayer dielectric 47, so as to cross over the word lines 41W, for example. The source contact 49 and drain contact 50 may be connected to metal pads 52 and 53 on the interlayer dielectric 47, respectively.

The string selection gate insulator and the ground selection gate insulator in the above exemplary embodiment need not include the charge trapping layer, thus, a string selection transistor and a ground selection transistor may have a lower threshold voltage as compared to a conventional transistor and may be turned on (energized) with a low voltage.

Moreover, the blocking layer may be made of a high-k dielectric material so that a thickness of the blocking layer may be thicker than that of a conventional blocking insulator, without increasing the voltage required for operation, and so as to reduce or prevent a current leakage.

FIGS. 5A through 5E are subsequent cross-sectional views illustrating a method of forming a NAND-type non-volatile memory device of FIG. 4.

Referring to FIGS. 5A and 5B, a field oxide 32 may be formed on a semiconductor substrate 31 to define an active region. In FIGS. 5A and 5B, the active region may be illustrated generally by dotted line boxes at 32a and 32b, for example. The semiconductor substrate 31 and field oxide 32 may be thermally oxidized at a temperature of less than 900° C. to form a thermal oxide (i.e., $SiO_2$) as a tunnel insulator 33. The tunnel insulator 33 may have a thickness of 20-40 Å, for example.

A silicon nitride ($Si_3N_4$) may be formed on a the semiconductor substrate 31 as a charge trapping layer 35. The charge trapping layer 35 may be formed by low-pressure chemical vapor deposition (LPCVD) process, for example, or by other deposition processes. The charge trapping layer 35 may have a thickness of 50-200 Å, for example. The charge trapping layer 35 and tunnel insulator 33 may be successively patterned in active region 32a in cell array area A and in active region 32b of a peripheral circuit area B (e.g., to provide specific locations where the thermal oxide is exposed. The patterning process may be performed using a photoresist pattern (not shown) as an etching mask. The patterning process may be carried out using a mask oxide that may be formed by a photoresist pattern, as is known, for example.

Referring to FIGS. 5C and 5D, a blocking insulator 37 may be formed on semiconductor substrate 31, after the charge trapping layer 35 and the tunnel insulator 33 are patterned, for example. The blocking insulator 37 may be formed by an atomic layer deposition (ALD) process or by another deposition process, for example. The blocking insulator 37 may be composed of materials having a higher dielectric constant than that of a silicon oxide ($SiO_2$), i.e., materials having a dielectric constant greater than 3.9, and a substantially large energy band gap. The blocking insulator 37 may be formed of a material selected from $Al_2O_3$, $HfO_2$ and $Ta_2O_5$. When the blocking insulator 37 is formed of aluminum oxide ($Al_2O_3$), the blocking insulator 37 may be formed to a thickness of about 100-300 Å. A conductive layer 41 may be formed on a surface of the semiconductor substrate 31, as shown in FIG. 5D. The conductive layer 41 may be formed of polysilicon and metal silicide, for example.

Figure 5E:
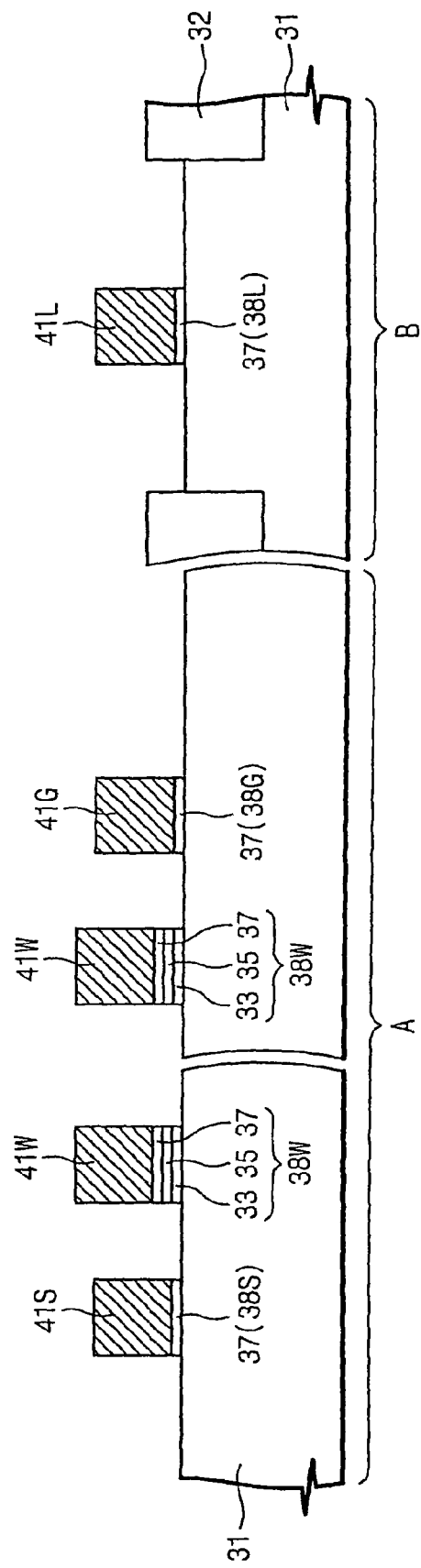

Referring to FIG. 5E, the conductive layer 41, blocking insulator 37, charge trapping layer 35 and tunnel insulator 33 may be patterned to form a string selection line 41S, ground selection line 41G and word lines 41W in the cell array area A, and, simultaneously, to form a low-voltage gate electrode 41L in the peripheral circuit region B. Thus, a cell gate insulator 38W may be formed between the word lines 41W and the semiconductor substrate 31; selection gate insulators 38S and 38G may be formed between the selection lines 41S and 41G and the semiconductor substrate 31; and a low-voltage gate insulator 38L may be formed between the low-voltage gate electrode 41L and the semiconductor substrate 31. The cell gate insulator 38W may comprise the tunnel insulator 33, charge trapping layer 35 blocking insulator 37, in a stacked manner, as shown in FIG. 5E. The selection gate insulators 38S and 38G, and low-voltage gate insulator 38L may be composed of a single layer, such as blocking insulator 37.

Although not shown in the drawings, impurity ions may be injected into the semiconductor substrate 31 to form the impurity diffusion layer 43 of FIG. 4, using the word lines 41W, the string selection line 41S, the ground selection line 41G, the low-voltage gate electrode 41L and the field oxide 32 as an ion implantation mask in a subsequent process, for example. As a result, a string selection transistor, cell transistors and a ground selection transistor may be formed in cell array area A, and a low-voltage transistor may be formed in the peripheral circuit area B.

A lower interlayer dielectric (not shown) may be formed on the semiconductor substrate 31 and transistors. A common source line 45 of FIG. 4 may be formed in the lower interlayer dielectric, to be electrically connected to the impurity diffusion layer, as is known. The impurity diffusion layer may be embodied as a source region of the ground selection transistor. An upper interlayer dielectric (not shown) may be formed on the semiconductor substrate and common source line 45. The bit line contact 48 of FIG. 4 may be configured so as to electrically connect to impurity diffusion layer 43 of FIG. 4, as is known. The impurity diffusion layer may be configured as a drain region of the string selection transistor. The source contact 49 and drain contact 50 of FIG. 4, may be electrically connected to the impurity diffusion layer 43 through the upper and lower interlayer dielectrics. The impurity diffusion layer 43 may be configured as the source and drain regions of the low-voltage transistor. A bit line 51 may be formed on the upper interlayer dielectric to connect with the bit line contact 48, and metal pads 52 and 53 may be formed to connect to source contact 49 and drain contact 50, for example.

Figure 6:
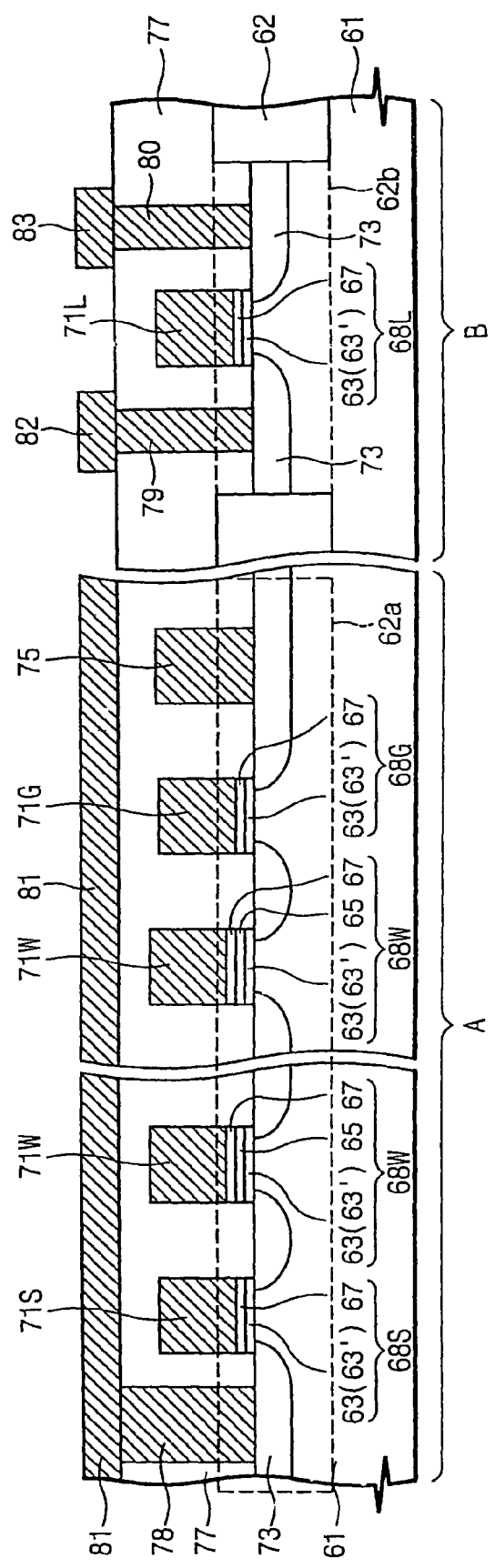
FIG. 6 is a cross-sectional view illustrating a NAND-type non-volatile memory device taken along a line of I-I' of FIG. 2 in accordance with another exemplary embodiment of the present invention.

FIG. 6 is a cross-sectional view illustrating a NAND-type non-volatile memory device taken along a line of I-I' of FIG. 2 in accordance with another exemplary embodiment of the present invention.

Unlike the previous exemplary embodiment, the string selection gate insulator, ground selection gate insulator and gate insulator of a low-voltage transistor in this exemplary embodiment may be embodied as a double-layered tunnel insulator and a double-layered blocking insulator of a memory device such as a NAND-type non-volatile memory device, for example.

As illustrated in FIG. 6, a tunnel oxide layer 63, charge trapping layer 65, and blocking insulator layer 67, which may be sequentially stacked, may be interposed between word lines 71W and an active region (see dotted line box 62a) in cell array area A of a semiconductor substrate 61. These layers may form a cell gate insulator 68W. A field oxide 62 may define the active region of the semiconductor substrate 61, as shown by dotted line boxes 62a and 62b. A tunnel insulator 63 or 63' and a blocking insulator 67 may be sequentially stacked and interposed between the active region 62a and a string section line 71S, and between the active region 62a and a ground selection line 71G, respectively. These stacked layers may be embodied as a double-layered string selection gate insulator 68S or ground selection gate insulator 68G in cell array region A, as shown in FIG. 6. Additionally, gate insulator 68L of the low-voltage transistor may also be of a double-stacked configuration, as shown in peripheral circuit area B of FIG. 6.

Similar to previous exemplary embodiments, an impurity diffusion layer 73 and a interlayer dielectric 77, common source line 75 and bit line 81 may be provided in cell array area A; and a source contact 79, drain contact 80 and metal pads 82 and 83 may be provided in peripheral circuit area B, as shown in FIG. 6.

FIGS. 7A through 7E illustrate of forming a NAND-type non-volatile memory device of FIG. 6.

Referring to FIG. 7A, a field oxide 62 may be formed on a semiconductor substrate 61 to define an active region. In FIGS. 7A and 7B, the active region may be illustrated generally by dotted line boxes at 62a and 62b, for example. A semiconductor substrate 61 and the field oxide 62 may be thermally oxidized at a temperature of about 900° C. or less to form a tunnel insulator 63 of silicon oxide ($SiO_2$). A silicon nitride ($Si_3N_4$) may formed on a surface of the semiconductor substrate 61 as a charge trapping layer 65. The charge trapping layer 65 may formed by LPCVD process, for example, or by other deposition processes.

Referring to FIG. 6B, the charge trapping layer 65 may be patterned to expose a portion of a tunnel insulator 63 at a cell array area A and at a peripheral circuit region B. Alternatively, the charge tapping layer 65 and the tunnel insulator 63 may be sequentially patterned to expose portions of active regions 62a, 62b at the cell array area A and at the peripheral circuit region B. By thermally oxidizing the exposed active regions, a new tunnel insulator 63' may be formed. For example, a thermal oxide is not formed on the charge trapping layer 65 (e.g., silicon nitride layer) in this exemplary embodiment.

Referring to FIGS. 7C through 7E, a blocking insulator 67 may be formed on an entire surface of the semiconductor substrate 61 by an ALD process, for example, or by another known deposition process. A conductive layer 71 may be provided on semiconductor substrate 61. The conductive layer 71, blocking insulator 67, charge trapping layer 65 and tunnel insulator 63 may be successively patterned to form a string selection line 71S, word lines 71W and a ground selection line 71G in cell array area A, and, simultaneously, to form a low-voltage gate electrode 71L on a peripheral circuit area B. As a result, a cell gate insulator 68W may be formed between the word lines 71W and semiconductor substrate 61, and selection gate insulators 68S and 68G may be formed between selection lines 71S and 71G and the semiconductor substrate 61. In addition, a low-voltage gate insulator 68L may be formed between the low-voltage gate electrode 71L and the semiconductor substrate 61. The cell gate insulator 68W may comprise the tunnel insulator 63, charge trapping insulator 65 and blocking insulator 67, which may be stacked, as shown in FIG. 7E. The selection gate insulators 68S and 68G may have a double layered structure, as may blocking insulator 67 and tunnel insulator 63 or 63', for example.

In each exemplary embodiment, the various forming and patterning processes may be used, with materials used for, and thickness of, each layer being identical in each exemplary embodiment. Additionally, although specific deposition processes have been described to form one or more of the layers, it should be understood that other known deposition processes, such as CVD, plasma CVD, PVD, metal oxide CVD (MOCVD), etc., could be substituted for the deposition processes described above.

According to the above-described exemplary embodiments, a memory device, such as a NAND-type non-volatile memory device with a SONOS gate structure, may be operated with a low voltage and with an amplified current, since one or more of the string selection gate insulator, ground selection gate insulator in the cell array area, and/or the low-voltage gate insulator of the peripheral circuit have a single layer construction (e.g., single layers blocking insulator), and since the blocking insulator and tunnel insulator may be of a double-layered construction. Additionally, since the blocking insulator may be formed of a high-k dielectric material, any potential current leakage may be reduced and/or completely prevented.

It should be understood that the non-volatile memory device formed in accordance with exemplary embodiments of the invention is not limited to a NAND-type non-volatile memory device. Other memory devices may be formed in accordance with the exemplary embodiments, including memory devices have gate structures other than SONOS gate structures.

Exemplary embodiments of the invention being thus described, it will be obvious that the same may be varied in many ways. Such variations are not to be regarded as a departure from the spirit and scope of the exemplary embodiments of the invention, and all such modifications as would be obvious to one skilled in the art are intended to be included within the scope of the following, attached claims.

What is claimed is:

1. A memory device, comprising:
   a semiconductor substrate comprising a cell array area and a peripheral circuit area;
   a plurality of word lines on the semiconductor substrate of the cell array area;
   a peripheral transistor in the peripheral circuit area;
   a string selection line and a ground selection line parallel to each other, the word lines being between the string selection line and the ground selection line;
   a cell gate insulating layer between the semiconductor substrate and the word lines, the cell gate insulating layer comprising a first insulating layer, a charge trapping layer and a blocking insulating layer,
   a string selection gate insulating layer between the semiconductor substrate and the string selection line, the string selection gate insulating layer thinner than the cell gate insulating layer; and
   a ground selection gate insulating layer between the semiconductor substrate and the ground selection line, the ground selection gate insulating layer thinner than the cell gate insulating layer,
   wherein the peripheral transistor comprises a peripheral gate insulating layer, the peripheral gate insulating layer including a second insulating layer and the blocking insulating layer.

2. The memory device of claim 1, wherein the blocking insulating layer comprises a material having a dielectric constant higher than that of silicon oxide.

3. The memory device of claim 2, wherein the blocking insulating layer comprises metal oxide.

4. The memory device of claim 3, wherein the blocking insulating layer comprises at least one of $Al_2O_3$, $HfO_2$, and $Ta_2O_5$.

5. The memory device of claim 1, wherein the charge trapping layer comprises silicon nitride.

6. The memory device of claim 1, wherein the first and second insulating layers comprise silicon oxide.

7. The memory device of claim 6, wherein the first and second insulating layers comprise thermal silicon oxide.

8. The memory device of claim 7, wherein the second insulating layer is formed of thermal silicon oxide formed by a process different from that of the first insulating layer.

9. The memory device of claim 1, wherein each of the string selection gate insulating layer and the ground selection gate insulating layer consists of
   a double layer of the second insulating layer and the blocking insulating layer.

10. The memory device of claim 1, wherein the charge trapping layer is on a surface of the first insulating layer and on a surface of the blocking insulating layer.

11. The memory device of claim 1, wherein the blocking insulating layer is a single layer structure.

12. The memory device of claim 1, wherein the charge trapping layer is comprised of silicon nitride and the blocking insulating layer is comprised of a metal oxide, the first insulating layer being on a surface of the substrate, the charge trapping layer being on a surface of the first insulating layer and the blocking insulating layer being on a surface of the charge trapping layer.

13. The memory device of claim 1, wherein the blocking insulating layer is a metal oxide.

* * * * *